United States Patent [19]
Pattisam et al.

[11] Patent Number: 5,357,614
[45] Date of Patent: Oct. 18, 1994

[54] DATA COMPRESSION CONTROLLER

[75] Inventors: Ravi Pattisam, Parma; Gary T. DalSanto, Stow, both of Ohio

[73] Assignee: Rexon/Tecmar, Inc., Solon, Ohio

[21] Appl. No.: 946,763

[22] Filed: Sep. 17, 1992

[51] Int. Cl.⁵ .............................................. G06F 13/14
[52] U.S. Cl. .................................. 395/250; 395/275; 395/425
[58] Field of Search ............... 358/261.1, 261.2, 261.3, 358/300, 430, 444; 364/260.6; 341/51, 59, 60, 61, 81, 82, 87, 95, 106; 395/250, 275, 425

[56] References Cited

U.S. PATENT DOCUMENTS

| | | | |
|---|---|---|---|
| 5,146,325 | 9/1992 | Ng | 358/135 |
| 5,155,484 | 10/1992 | Chambers | 341/55 |
| 5,194,995 | 3/1993 | Severtson et al. | 364/900 |
| 5,198,898 | 3/1993 | Miyater | 358/75 |

FOREIGN PATENT DOCUMENTS 0324542  7/1989  European Pat. Off. ............... 3/6

OTHER PUBLICATIONS

Merk Bianchi & Jeff Kato, "Data Compression in a Half-Inch Reel-to-Reel Tape Drive", Hewlett-Packard Journal, Jun. 1989, pp. 26–31.

Primary Examiner—Dale M. Shaw
Assistant Examiner—Moustafa M. Meky
Attorney, Agent, or Firm—Maria McCormack Sobrino

[57] ABSTRACT

A data compression controller for processing data between a host system and at least one device is disclosed. The data compression controller comprises a compression coprocessor for converting data between first format and second format at a determined controller ratio. The compression has two buffers for storing data of the first and second formats. When data is to be compressed, the coprocessor receives data directly from the host system into the first buffer. The coprocessor reads the buffered data and compresses the data for output to the external device through the second buffer. A coprocessor interface is coupled to the coprocessor for monitoring the buffers to determine the state of the buffers and the coprocessor; for example, if the such that the data to be compressed flows smoothly and consistently through the coprocessor. The input/output (I/O) controller is coupled to the coprocessor and the device for transferring data between the second buffer and the device. The I/O controller interface monitors the state of the I/O controller and provides the necessary control signals to indicate when to begin the transfer of compressed data to the device. In addition, the I/O controller interface configures and controls the I/O controller according to the device. Therefore, a single An application interface is coupled to the host system, for decoding commands from the host system, and issuing corresponding signals to the components of the controller to execute the commands. The application interface monitors the status of the controller through the I/O controller interface and the coprocessor interface and provides status information to the host system such that the host timely provides data to the coprocessor and the necessary commands to the application interface to maintain continuous movement of data through the coprocessor.

13 Claims, 4 Drawing Sheets

DATA COMPRESSION CONTROLLER

BACKGROUND OF THE INVENTION

1. Field of the Invention

The present invention relates to data compression devices, and more specifically to the data compression controllers communicating between a host system and external devices.

2. Art Background

As the sophistication of computer systems increases so does the need for manipulation of large amounts of data generated by the computer systems. Data compression is often used to minimize the size of certain data while maintaining the information contained therein. Data compression is also typically utilized to minimize the bandwidth of data transmitted or stored. Prior to transmission or storage, the data are compressed. The data are subsequently decompressed after transmission or after the data are retrieved from storage.

For example, it has become more and more common to create back-up memory storage on external storage devices for the main memory of a computer system. The hard disk drive in a personal computer system is often periodically backed up to an external tape drive. To maximize tape usage, the data from the hard disk drive are compressed before the data are subsequently loaded onto the tape drive. FIG. 1 illustrates a functional configuration for a memory backup system 1. Hard disk drive 11 and system random-access memory (RAM) 12 are typically configured with the host computer system CPU 13, while compressor (comp/de-comp) 15 is typically located on a separate card inserted into a slot on the bus. The CPU 13 controls the process. Under control of the CPU 13, the data stored in hard disk drive 11 are first transferred, through system bus 10, to RAM 12. The CPU 13 then forwards the data located in RAM 12 to comp/de-comp 15 which compresses the data. The CPU 13 causes compressed data to be stored again in RAM 12 before subsequently transferring the data to tape drive 14. Tape drive 14 is typically a streaming device with its efficiency dependent upon the continuity of data flow. Note that tape drive 14 is typically connected to the host computer system through a device bus, such as SCSI bus 16. Loading compressed data from tape drive 14 requires the same process in reverse with the de-compressor feature of comp/decomp 15. As can be appreciated by those skilled in the art, the back-up process is a slow and time-consuming due to the multiple bus transactions required for each data storage and data retrieval.

Because the data stored in hard disk drive 11 are almost always in different format, e.g. bit maps, spreadsheets, windows, and texts, etc., different compression ratios are applied by comp/decomp 15 as different data files are compressed. As a result, during a back-up process of various files from hard disk drive 11, tape drive 14 ends up in a stop-and-go state because the difference in compression ratios prevents the CPU 13 from providing a continuous stream of data to comp/decomp 15 and to tape drive 14. Furthermore, the back-up process requires the constant intervention from the CPU 13, thus diverting the CPU 13 from its other processing tasks. The conventional approach has therefore been found to be quite inefficient in terms of both processor and tape drive usage.

In addition, because compressed and decompressed data must be buffered through system RAM 12, the capacity of system RAM 12 directly affects the data through-put as more and more system-oriented software of a computer system, such as operating systems and network applications, must be stored in system RAM 12. The amount of memory in RAM 12 for compression and decompression storage may not be able to keep up with data flow, resulting in a slow down of the process and more frequent intervention by CPU 13 to facilitate the transfer of data which quickly fill the capacity of the buffers in RAM 12.

One alternative is to provide an on-board compression engine with each external or storage device (e.g. tape drive 14) to minimize the number of bus transactions and the frequency of CPU 13 involvement. However, this is not a practical option because of the increased cost of configuring a compression sub-system with each storage device. Furthermore the addition of hardware compression may not be possible with many existing external devices.

Therefore, it is desirable to have a data compression device capable of interfacing to a multiplicity of storage devices without continuous intervention by the host system.

SUMMARY OF THE INVENTION

A data compression controller for processing data between a host system and at least one storage device or transmission media is disclosed. Through the data compression controller of the present invention, the need for multiple bus operations is eliminated. Furthermore, by elimination of multiple bus operations and the provision of on-board control of the compression and I/O components, data streaming to the output device is achieved. The data compression controller comprises a compression coprocessor, an input/output (I/O) controller, an I/O interface, a compression coprocessor, a compression coprocessor interface, and an application interface.

The compression coprocessor converts data between first a normal or uncompressed format and a second compressed format at a determined compression ratio. The compression controller includes a first buffer for storing data of the first and second formats. When data is to be compressed, the compression coprocessor receives data directly from the host system into a buffer. The coprocessor reads the buffered data and compresses the data for output to the external device. Similarly, when compressed data from an external device is received in a second buffer, the compression coprocessor decompresses the data and outputs the decompressed data through the buffer to the host.

A compression coprocessor interface is coupled to the compression coprocessor for monitoring the buffers to determine the state of the buffers and the coprocessor; for example, if the buffers are empty or full and if the coprocessor is busy. The compression coprocessor interface determines this information such that the data to be compressed/decompressed flows smoothly and consistently through the compression coprocessor.

The input/output (I/O) controller is coupled to the compression coprocessor and the external device or transmission media for transferring data between the second buffer and the external device. The I/O controller interface monitors the state of the I/O controller and provides the necessary control signals to indicate when to begin the transfer of compressed data to/from an external device or transmission media, the external output device or transmission media to be accessed and the device specific protocol to be utilized. In addition, the I/O controller interface configures and controls the I/O controller according to the external device. Therefore, a single controller can couple to a variety of different external devices.

An application interface is coupled to the host system, compression coprocessor interface and I/O controller for monitoring and decoding commands from the host system, and issuing corresponding signals to the components of the controller to execute the commands. The application interface monitors the status of the I/O controller, compression coprocessor and buffers through the I/O controller interface and the coprocessor interface and provides information regarding the state of processing of the controller to the host system such that the host timely provides data to the compression coprocessor and the necessary commands to the application interface to maintain continuous movement of data through the compression coprocessor.

In one embodiment, the data compression controller is utilized to compress data for storage in a tape drive. To output data to a tape drive, the host issues a command to perform the compression and storage operation to the controller and supplies data to the compression coprocessor. The controller receives the data, performs the compression and transfer of compressed data to the external device without the additional bus transactions required by prior art devices. Furthermore, by controlling the flow of data through the compression coprocessor, the flow of data written to or read from the tape drive can be controlled by the compression controller of the present invention to permit the tape drive to continuously stream the data, thereby increasing the efficiency and overall throughput of the process.

BRIEF DESCRIPTION OF THE DRAWINGS

The objects, features and advantages of the present invention will become apparent to one skilled in the art from reading the following detailed description in which.

DETAILED DESCRIPTION OF THE INVENTION

A high throughput data compression controller for processing and transferring data between a host computer system and external devices or transmission media is disclosed. In the following description, numerous specific details are set forth in order to provide a thorough understanding of the present invention. It will be obvious, however, to one skilled in the art that these details are not required to practice the present invention. In other instances, well-known circuits, methods and the like are not set forth in detail in order to avoid unnecessarily obscuring the present invention. In particular, the following discussion describes the data compression controller and its operation during data compression. It will be obvious, however, that the controller works equally effectively by performing the reverse, i.e., decompression operation, and that the flow of data from the host system through the compression coprocessor of the host system is achieved at an equally high throughput. In addition, in the embodiment described herein, the compression controller provides an SCSI interface and is coupled to an SCSI compatible device, specifically a tape drive, for storage of data in a compressed format. However, it will be obvious to one skilled in the art that other interfaces may be provided depending upon the application. Furthermore, it will be apparent that other types of devices as well as transmission media may be coupled to the compression controller to receive output and provide input.

Figure 1:
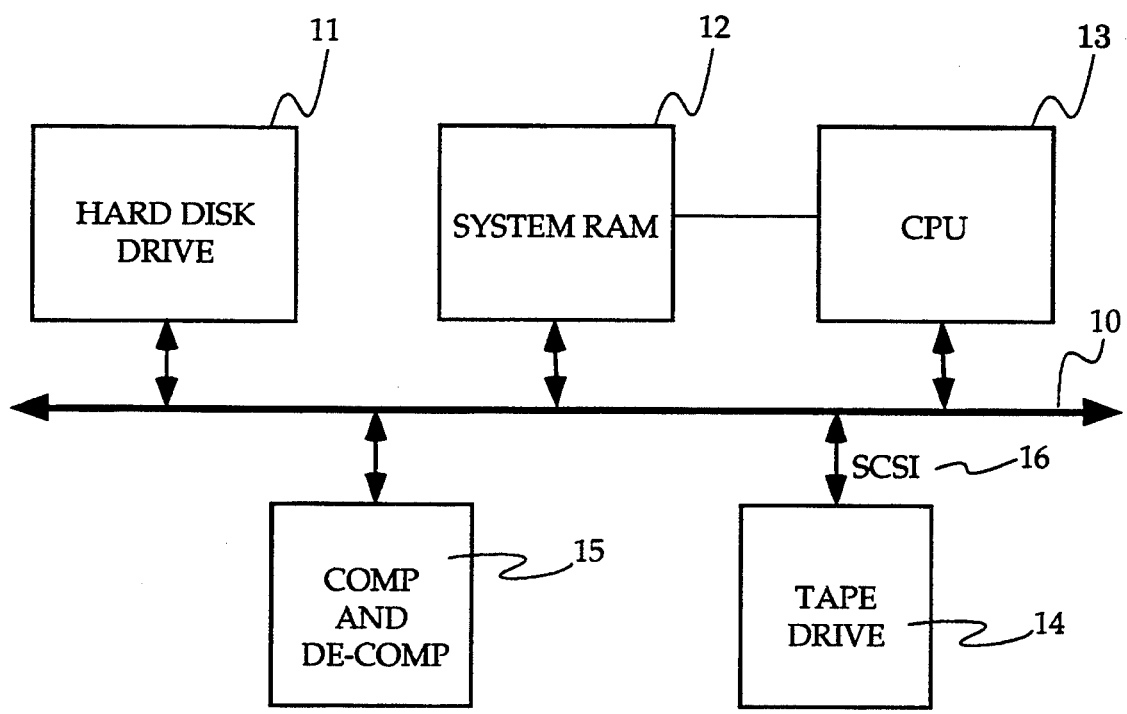
FIG. 1 illustrates a functional configuration for a prior art memory backup system.
Figure 2:
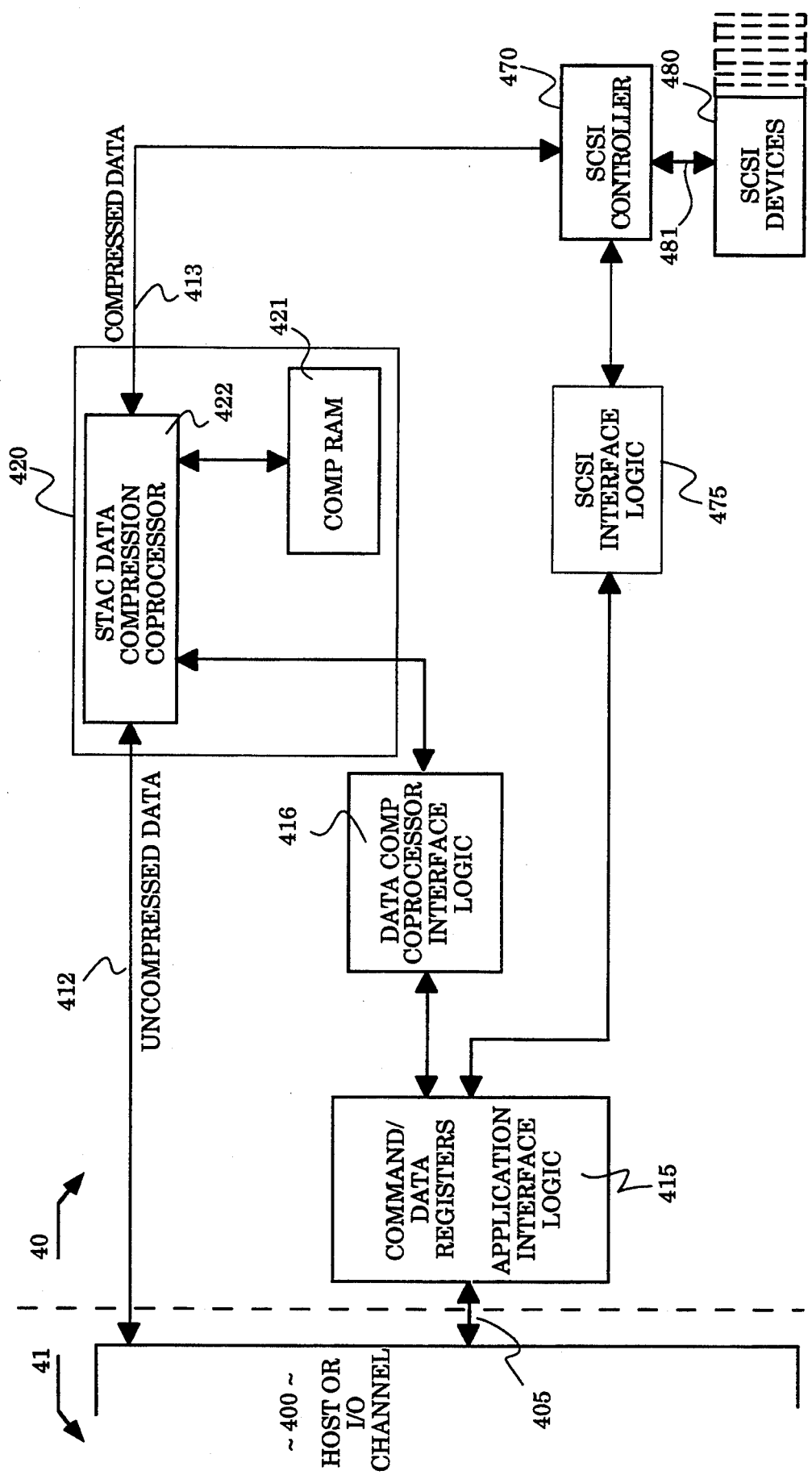
FIG. 2 illustrates a simplified block diagram of one embodiment of data compression controller.

Reference is now made to FIG. 2, which illustrates a simplified block diagram of one embodiment of data compression controller 40. Data compression controller 40 is coupled to host or I/O channel 400 of a host system 41 through connections 412 and 405. Connection 412 couples data compression coprocessor 420 to communicate data to and from host system 41 through host channel 400. Connection 405 couples command/data registers and application interface logic 415 to the host system 41.

Connection 412 couples the host or I/O channel 400 of host system 41 to the compression coprocessor 420 for the transfer of uncompressed data between the host 41 and compression coprocessor 420. The host channel may be any type of direct connection or a bus, such as an ISA bus, EISA bus or Micro Channel ® bus (Micro Channel is a trademark of International Business Machines). Preferably, both programmed I/O and direct memory access (DMA) transfers can be utilized to transfer data between the host 41 and compression coprocessor 420. In particular, it is preferred that the compressor coprocessor 420 includes a DMA controller for performing DMA operations. Connections 412 and 405 are currently shown as two physically separate connections. However, these connections may alternately be combined into a single connection or be mapped as a single address which couples the host system 41 to the application interface logic 415. The application interface logic would therefore function to forward the data to the compression coprocessor for processing.

Communication of commands and status information is achieved through application interface logic 415. Application interface logic monitors data and command registers accessed by the host system in order to receive commands issued by the host processor and generates the appropriate signals to the components of the controller 40 to execute the commands. Furthermore, the application interface logic 415 receives status information from the components of the controller 40 and provides the host system 41 with status of the controller operation such that the host system 41 can transfer data and issue additional commands in a timely manner during processing.

In the present embodiment, the application interface logic 415 issues control signals to compression coprocessor interface logic 416 and SCSI interface logic 475 and receives status information from compression coprocessor interface logic 416 and SCSI interface logic 475. For example, the application interface logic 415 monitors the I/O ports between the host system 41 and the controller 40 to determine when the host system 41 issues a command and receives information regarding the state of compression coprocessor 420 through compression coprocessor interface logic 416 to indicate to the host system when the host should send data to the compression coprocessor 420, and issues a signal to compression coprocessor 420 to perform an operation once data is transferred by the host system.

As will be discussed subsequently, the controller status information is utilized to permit multi-tasking on the controller 40 as well as to control the flow of data through the controller 40 in order to achieve a constant data throughput regardless of the type of data and data compression ratio achieved. The application interface logic 415 may be implemented as a state machine, as a dedicated hardware device, by software in conjunction with a general purpose processor or firmware.

In the present embodiment, the application interface logic consists of a plurality of configurable registers and decode logic to communicate information between the host processor and the data compression coprocessor and I/O controller. For example, the registers can be configured as:

AI[0] Board ID for Data Compression
AI[1] Board ID for Data Compression
AI[2] Configuration Byte for Board Enable and PIO Enable bit
AI[3] Configuration Byte to Select the DMA Channel and Interrupt Channel
AI[4] Configuration Byte for MPU Register Access
AI[5] Configuration Byte for MPU Register Data
AI[6] Register to Access Input FIFO of data compression coprocessor through Programmed I/O
AI[7] Register to Access Input FIFO of data compression coprocessor through Programmed I/O in 8 bit High Byte The first two bytes AI[0] and AI[1] contain the board ID. This is configurable to accommodate system configuration having different external devices and boards. AI[3] contains programmable options. The bit definitions are as follows:

| Bit | Assignment |
| --- | --- |
| 7 | Reserved |
| 6 | Programmed I/O 8/16 bit transfer select. |
| 5 | Programmed I/O Enable. |
| 4 | Reserved |
| 3-1 | I/O Controller Phase Change Select Bits (Write only) |
| 4-1 | Status of the Switch settings (Read back only) |
| 0 | Board Enable. |

The I/O controller phase change select bits represent the I/O signals (SCSI) during a write operation. Bit 3 represents the SCSI signal I/O, bit 2 represents the SCSI signal MSG and bit 1 represents the SCSI signal C/D. The driver software will set these bits to a desired value signifying the current I/O controller phase. When the corresponding signals from the I/O bus take on a value different from the value in the register, an interrupt will be generated. This interrupt signifies an I/O controller bus phase change which is reflected back on AI[4] bit 6.

AI[2] bits 4-1 reflect switch settings which indicate the base I/O address. AI[2] bit 0 is the enable bit for data transfers between the host and the port connected to the FIFO input buffer. When the bit is set to 0, transfers to the port are disabled. Interrupts from the controller to the host and DMA requests to the host will not be driven. Furthermore, no programmed I/O transfers are permitted (even if AI[2] bit 5 is set to 1).

Programmable adapter options are written to read/write register AI[3]. Bit definitions for AI[3] are:

| Bit | Assignment |
| --- | --- |
| 7-5 | Controller DMA Channel Select Bits |
| 4-1 | Controller Interrupt Select Bits |
| 0 | Controller Interrupt Enable Bit |

AI[3] bits 7-5 select the controller DMA channel to be used to transfer data between the host and the input port to the FIFO buffered data of the data compression coprocessor. Based on the DMA channel selected either 8 bit or 16 bit transfers are allowed. Further, in order to access the DMA channels, AI[2] bit 5 must be cleared, i.e., set to zero and the AI[2] bit 1 is set to 1. The definitions for these bits are as follows:

| | Bits | | | |
| --- | --- | --- | --- | --- |
| 7 | 6 | 5 | DMA Channel Enabled. | 16 Bit/8 Bit Mode |
| 0 | 0 | 0 | 1 | 8 bit |
| 0 | 0 | 1 | 2 | 8 bit |
| 0 | 1 | 0 | 3 | 8 bit |
| 0 | 1 | 1 | not used | |
| 1 | 0 | 0 | 5 | 16 bit |
| 1 | 0 | 1 | 6 | 16 bit |
| 1 | 1 | 0 | 7 | 16 bit |
| 1 | 1 | 1 | not used | |

AI[3] bits 4-1 select the interrupt to be used. This is a common interrupt for both the interrupts generated by data compression coprocessor and I/O controller chips. The interrupts are made active only when the interrupt enable bit AI[3] bit 0 is set to 1, in conjunction with AI[2] bit 0 set to 1. The definitions for these bits are as follows:

| Bits | | | | |
| --- | --- | --- | --- | --- |
| 4 | 3 | 2 | 1 | Interrupt Enabled |
| 0 | 0 | 0 | 0 | 3 |
| 0 | 0 | 0 | 1 | 4 |
| 0 | 0 | 1 | 0 | 5 |
| 0 | 0 | 1 | 1 | 6 |
| 0 | 1 | 0 | 0 | 7 |
| 0 | 1 | 0 | 1 | 9 |
| 0 | 1 | 1 | 0 | 10 |
| 0 | 1 | 1 | 1 | 11 |
| 1 | 0 | 0 | 0 | 12 |
| 1 | 0 | 0 | 1 | 14 |
| 1 | 0 | 1 | 0 | Reserved |
| 1 | 0 | 1 | 1 | 15 |
| 1 | 1 | X | X | Reserved |

When AI[3] bit 0 is set to 1, interrupts are allowed to pass to the host channel to the host. When this bit is cleared then no interrupts are allowed. This is useful for the situation when interrupts from both the data compression coprocessor and I/O controller are generated; when both interrupts occur, one interrupt is processed and other interrupts are masked and again enabled so as to generate the interrupt on the host channel without losing any interrupts from the controller.

The register AI[4] determines which physical register of either the data compression coprocessor and/or the I/O controller responds to the I/O access of AI[5]. Only the lower four bits decode the sixteen registers of the data compression coprocessor and I/O controller interface chips. The definitions for these bits are as follows:

| For a write operation: | |
|---|---|
| bit | assignment |
| 7-4 | reserved |
| 3-0 | adapter register select bits |

AI[4] bits 3-0 define the physical register of the data compression coprocessor interface and/or the I/O controller interface being accessed, when an I/O access is made to the POS register 5. The bit definitions are as follows. The first eight registers are for the data compression coprocessor chip and the remaining eight are multiplexed with the I/O controller registers of the SCSI controller interface. The data compression coprocessor chip has to be programmed to access the external peripheral registers by setting the mode bit in the configuration register of data compression coprocessor chip interface.

| For a read operation: | |
|---|---|
| Bit | Assignment |
| 7 | Reserved (currently not used) |
| 6 | Reflects the status of I/O controller phase change interrupt |
| 5 | Reflects the status of the I/O controller interrupt. |
| 4 | Reflects the status of the data compression coprocessor |
| 3-0 | Reflects the status of the NffU register select bits |

AI[4] bit 7 is currently not read back and will be I as the data lines are pulled high internally.

AI[4] bit 6 reflects the status of the I/O (i.e., SCSI) phase change interrupt. When this bit is set to 1, no interrupt is pending from the phase change comparator. When this bit is set 0, the interrupt from phase change comparator is pending and has to be serviced.

AI[4] bit 5 reflects the status of the I/O controller interrupt. When this bit is set to 1, no interrupt is pending from the I/O controller chip. When this bit is set 0, the interrupt from I/O controller chip is pending and has to be serviced.

AI[4] bit 4 reflects the status of the data compression coprocessor interrupt. When this bit is set to 1, no interrupt is pending from the data compression coprocessor chip. When this bit is set 0, the interrupt from data compression coprocessor chip is pending and has to be serviced.

AI[4] bits 3-0 reflect the MPU register select bits which have been written by the earlier or the most recent AI[5] access.

Programmable adapter options are written to AI[5] read/write register. The I/O/data compressor register pointer address is stored in register AI[4]. During normal operations, the various I/O interface and data compression coprocessor registers can be read or written through AI[5]. The various bit configuration for the registers are shown in register AI[4]. Bit definitions for AI[5] are:

| Bit | Assignment |
|---|---|
| 7-0 | data to be written or Read from the data compression coprocessor/I/O controller registers. |

The register AI[6] is used to perform the Programmed I/O (PIO) to transfer data between host and the input port to the data compression coprocessor. This is a read/write register and mimics the DMA to the input port. This register is accessible for both 8/16 bits and is enabled by AI[2] bit 5, and AI[2] bit 0.

The register AI[7] is used to perform the programmed I/O to transfer data between host and the input FIFO buffer of the data compressor, in the byte mode operation to transfer the high byte. This is a read/write register and mimics the DMA to the input port. This register is accessible for both 8 bit and 16 bit data and is enabled by AI[2] bits 5-6, and AI[2] bit 0.

As is apparent to one skilled in the art, the configuration of registers is illustrative and other configurations and manipulation of the same are contemplated.

Data compression coprocessor 420 receives as input uncompressed or compressed data and performs a compression or decompression operation on the data. The ratio at which the operations are performed are dependent on the type of data. The more repetitive the nature of the data, the higher the compression ratio. A compression history is generated during compression and is output with the compressed ratio. This compression history is subsequently used to decompress the data. The compression coprocessor typically comprises a plurality of elements such as the processor 422 which performs the compression and decompression operations and memory 421 which provides the input/output buffers and memory for storage of the compression history during processing. Preferably, compression coprocessor 420 is implemented in a STAC 9705 data compression coprocessor, available from STAC Electronics, Carlsbad, Calif.; however, it should be apparent to those skilled in the art that there are other compression coprocessors capable of achieving the intended functionality. Data compression controller 40 eliminates the need for going back and forth with the buffers in a main memory on the host system side by using a compression coprocessor with internal buffers, along with the interface logic, 415, 416, to improve the efficiency of utilization of the internal buffers as well as improve the efficiency of the basic I/ 0 decoding, address decoding and interrupt decoding. By taking advantage of the built-in buffers on the data compression coprocessor, buffering data in the main memory through the system bus is avoided.

Data compression coprocessor interface logic 416 controls the data flow through compression coprocessor 420 to insure that the data flow is constant through the compression coprocessor regardless of the data compression ratio which varies according to the type of data. The coprocessor interface issues control signals such as the operation to be performed (e.g. compression, decompression) as well as status signals. The interface logic 416 monitors the state of the coprocessor 420, in particular, the internal input/output buffers in the memory 421 of the coprocessor 420 in order to insure that data is consistently available for the coprocessor to operate on and buffer space for processed data is available for temporary storage of processed data prior to output to the I/O controller 470 or the host 41. In the present embodiment, the number of bytes compressed are monitored such that data is transferred to the I/O device in blocks. For example, a block can be 32 bytes. Therefore, the host will cause header information to be written into the output FIFO buffer at the beginning of a block of data. Data is then compressed and written into output FIFO buffer. In the embodiment described herein, the buffer is sized to be 16 bytes. Therefore, header information is written into the output buffer every other buffer of data or every number of bytes equal to the difference of 32 bytes and number of bytes in the header.

The interface logic 416 may be implemented as a state machine, as a dedicated hardware device, by software in conjunction with a general purpose processor or firmware. In the present embodiment the data compression coprocessor interface logic contains hardware to monitor the state of the compression coprocessor and registers for maintaining state information and for communication between the application interface logic and the data compression coprocessor. An exemplary register configuration is as follows:

| Bits | | | | Register Description |
|---|---|---|---|---|
| 3 | 2 | 1 | 0 | |
| 0 | 0 | 0 | 0 | Data compression coprocessor configuration register 1 |
| 0 | 0 | 0 | 1 | Data compression coprocessor configuration register 2 |
| 0 | 0 | 1 | 0 | Data compression coprocessor configuration register 3 |
| 0 | 0 | 1 | 1 | FIFO access register |
| 0 | 1 | 0 | 0 | Command/status 1/control register |
| 0 | 1 | 0 | 1 | Map register |
| 0 | 1 | 1 | 0 | Counter low |
| 0 | 1 | 1 | 1 | Counter high |

As described earlier, the host processor can access state information regarding the coprocessor (such as when it may be required in order to service an interrupt) by writing and reading from the I/O register of the application interface (AI [5]) in order to access the appropriate register in the compression coprocessor interface logic.

The I/O controller 470 is coupled to data compression coprocessor 420 and I/O interface logic 415 and external devices 480. Compressed data are transferred through bus 413 from data compression coprocessor 420 to I/O controller 470 before the data is transferred to external device 480. The I/O controller outputs data in accordance with the protocol of the specified output device 480. In the present embodiment, the I/O controller is a SCSI controller. SCSI controller is currently implemented in an NCR 5380 SCSI protocol controller, available from NCR Microelectronics, Colorado Springs, Colo.; however, it should be apparent to those skilled in the art that other SCSI controllers and other types of Input/Output (I/O) controllers may also be used to achieve the intended functionality.

The I/O controller interface logic, referred to herein as SCSI controller interface logic 475, similarly communicates with SCSI controller 470 to control the operation of the SCSI controller 470 and monitors the state of the controller for feedback to determine the flow of data and the state of the controller during processing, thus minimizing the host involvement in the control of the flow of data through the SCSI controller. For example, the SCSI controller interface logic 475 issues control signals such as the operation to be performed, the identification and type of external device the output is to be directed to, hardware handshaking to the I/O controller device and issues interrupts when need to the host processor indicating the state of the I/O controller.

The SCSI controller interface logic 475 also monitors the state of the SCSI controller 470 to insure smooth data flow through the controller to the SCSI device 480. For example, the SCSI interface logic monitors whether the SCSI controller has completed output of the data to the external device and whether errors occurred during output. It will be obvious to one skilled in the art that the SCSI controller interface logic is modified in accordance with the type of controller and type of external devices used. Preferably, the SCSI interface logic is configurable on a per-application basis by downloading of specific SCSI controller and device information prior to processing the data. Therefore, once formatted, the compressed data are then transferred to an identified external device 480 through SCSI controller 470 as controlled and monitored by the SCSI interface logic 475.

The SCSI interface logic 475 may be implemented as a state machine, in hardware, in software or a combination of the above; however, the logic 475 is preferably implemented in firmware to control and service the various interrupts and states communicated by the SCSI controller 470 for the particular external device 480. For example, when data is available for transfer to the external device, the SCSI interface logic 475 issues a command to the SCSI controller to begin the data transfer to the external device and continues to monitor the state of the transfer including processing interrupts issued by the SCSI controller 470 when data transfer is complete or if an error occurs during transfer.

In the present embodiment, SCSI controller interface logic consists of hardware to monitor the state of the SCSI controller and a plurality of registers utilized to maintain information regarding the state of the SCSI controller and to communicate between the application interface logic and the SCSI controller. For example, for an SCSI controller in compliance with NCR 53C80 specifications, the registers would be configured as follows:

| Bits | | | | Read Operation | Write Operation |
|---|---|---|---|---|---|
| 3 | 2 | 1 | 0 | | |
| 1 | 0 | 0 | 0 | Current I/O controller data | output data (to drive) |
| 1 | 0 | 0 | 1 | Initiator command register | initiator command register |
| 1 | 0 | 1 | 0 | Mode register | mode register |
| 1 | 0 | 1 | 1 | Target command register | target command register |
| 1 | 1 | 0 | 0 | Current 1/0 controller bus status reg | select enable register |
| 1 | 1 | 0 | 1 | Bus and status register | start DMA send register |
| 1 | 1 | 1 | 0 | Input data register | start DMA target receive reg |
| 1 | 1 | 1 | 1 | Reset/parity/interrupt reg | start DMA initiator register |

In the present embodiment, the controller may function as follows to transfer data located on a hard disk of the host system in a compressed format to a tape drive coupled to an SCSI controller port of the controller. Data is transferred by the host into host memory and out to a DMA channel directly to the input FIFO (located in compression RAM 421) using 16 bit data transfers. When the input FIFO is full, a compression coprocessor 420 interrupt occurs, telling the host processor, which monitors for interrupts, to issue a compression command so that the data in the input FIFO can be compressed and output to output FIFO (also located in RAM 421). As data gets read from the input FIFO and compressed and output into the output FIFO, more data can be transferred (via DMA or PIO) from the hard disk into the FIFO. When the output FIFO is full, an interrupt will occur, indicating that compressed data is ready to send to the I/O controller. The block of data is sent via DMA to the SCSI controller device. Thus, data will be continuously loaded from the hard disk (stopped only when the input FIFO is full), and the compressed data is continuously read by the SCSI controller and sent the SCSIdevice, such as a tape drive.

In the present embodiment, through the utilization of interrupts to the host and the application interface logic, data compression coprocessor interface logic and I/O controller interface logic, the controller 40 of the present invention provides a host system 41 the ability to simply transfer data at a high rate directly across the bus to compression coprocessor 420 for compression and output to an I/O device such as a tape drive without additional transfer of data across the bus or dedicated control of the process by the host system. Furthermore, as the processing of the data is monitored locally on the controller, the flow of data is closely controlled and the streaming of data output to the tape drive or the streaming of data input from the tape drive is achieved. Therefore, the overall efficiency of the storage and retrieval operation on the tape drive is achieved as the tape drive does not have to repeatedly start and stop in accordance with the flow of data. In addition, the compression controller of the present invention provides the capability to interface to a plurality of output devices without the addition of processing overhead to the host system and without the need to provide a separate compression coprocessor for each output device.

Figure 3:
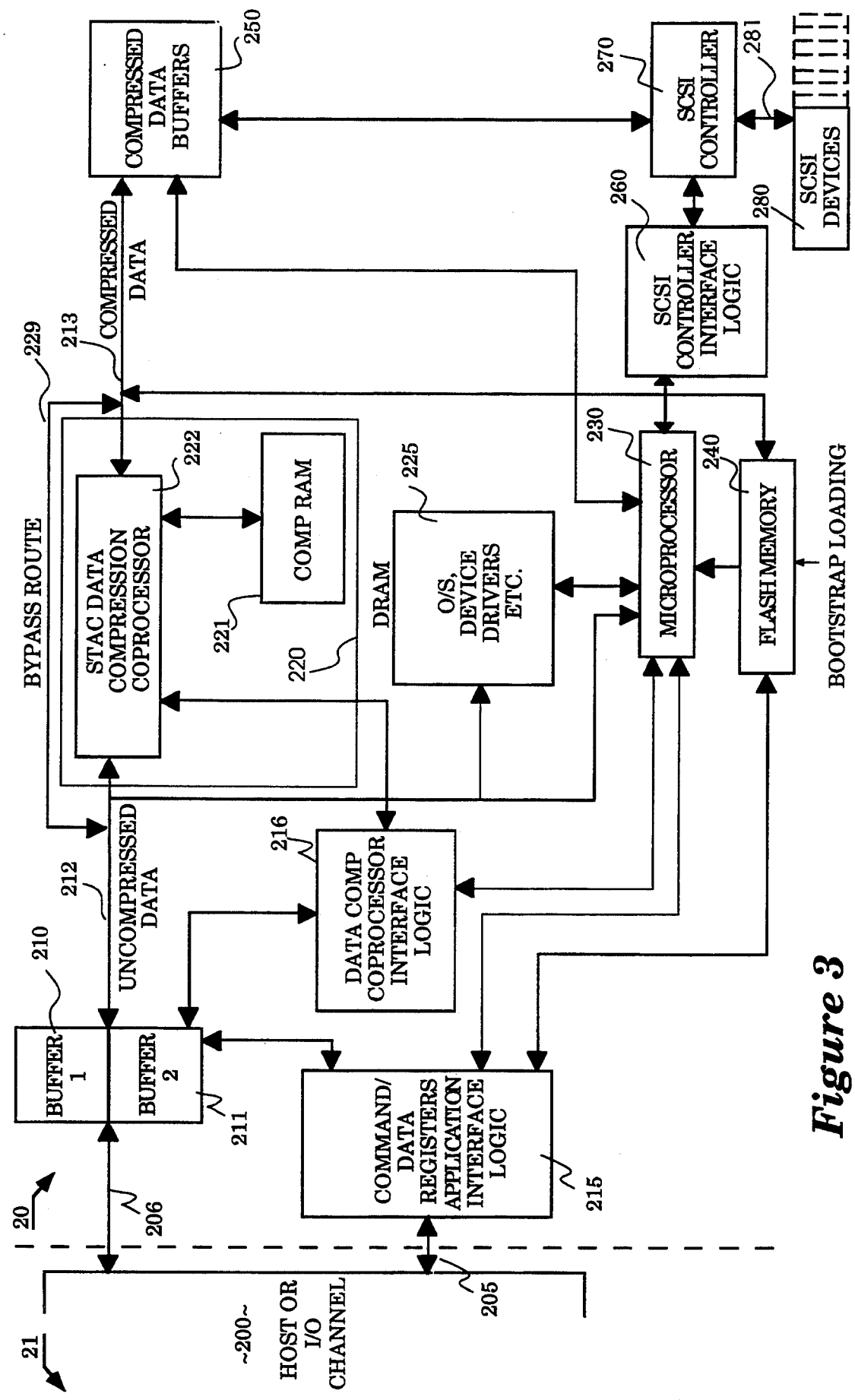
FIG. 3 illustrates a functional block diagram of another embodiment of data compression controller in accordance with the teachings of the present invention.

Reference is now made to FIG. 3, which illustrates a functional block diagram of another embodiment of data compression controller 20 in accordance with the teachings of the present invention. In this embodiment, the controller is additionally provided with a microprocessor 230, uncompressed and compressed buffers 210, 211, 250 and flash memory 240. These added components provide an independent on-board capability which further minimizes the host system's interaction with respect to the compression operations and input/output operations to the SCSI devices and closely monitors and controls the flow of data through the compression coprocessor to provide a consistent high speed throughput of data.

Data compression controller 20 is coupled to the host or I/O channel 200 of a host system 21 through connections 206 and 205. In particular, commands and status information are communicated between the host system 21 and the application interface logic 215 of the controller 20 via connection 205. The host system communicates data to the compression coprocessor 220 through connection 206 via uncompressed data buffers 210, 211. The buffers 210, 211, are also coupled to application interface logic 215, which maintains an identification of the buffer currently accessed through connection 206 by the host system and controls access to the buffers 210, 211. Double buffering is provided to provide a greater throughput and to eliminate the need for the host or the compression coprocessor to wait until uncompressed buffer memory is available. Access to the buffers will alternate back and forth as data is written to and read from the buffers 210, 211. Preferably, each of the buffers are of sufficient size to accommodate varying data rates.

Therefore, for example, if a compression operation is ongoing, the application interface logic 215 monitors the contents of the buffers 210 and 211. The host system is directed to first write data to be compressed to a first buffer, e.g., buffer 210. When this buffer is full, the host then writes data to buffer 211 and subsequently, once buffer 211 is full, to buffer 210. Coincidentally, data to be compressed is read initially from the buffer 210 and subsequently buffer 211 by compression coprocessor 220. By the time buffer 211 is full, the data in buffer 210 has been retrieved by compression coprocessor 220 and the buffer 210 is again available for additional incoming data. Preferably, access to the buffers is controlled such that the host system accesses one buffer while the compression coprocessor accesses the other buffer. However, if the buffers are configured as a dual port memory device, concurrent access to the same buffer can be performed. The double buffers provide the flexibility needed to accommodate the different data rates into and out of the buffers while maintaining an overall high throughput by minimizing any wait time that may be incurred while waiting to transfer data to the compression coprocessor or waiting for acknowledgment to transfer data to the host system.

As discussed earlier, the data compression coprocessor 220 comprises a coprocessor 222 and memory 221. The compression coprocessor is controlled and monitored by compression coprocessor interface logic 216. The output of the coprocessor 220 during a compression operation is the compressed data and compression history. This data is output via compressed data bus 213 to compressed data buffers 250.

The compressed data is formatted in a manner compatible with the identified external device 280. Format information such as header information and error correcting codes (ECC) are added. Preferably this is performed by microprocessor 230. Similarly, during a decompression operation, the microprocessor strips the header information from the data and checks the ECC information to determine if any errors occurred prior to access to the data by compression coprocessor 220.

Once formatted, the compressed data are then transferred to an identified external device 280 through SCSI controller 270 as controlled and monitored by the SCSI interface logic 260. The SCSI controller interface logic 260 is preferably implemented in firmware to control and service the various interrupts and states communicated by the SCSI controller 270 for the particular external device 280. For example, when data is available for transfer to the external device, the SCSI controller interface logic 260 issues a command to the SCSI controller to identify the specific device and the type of device and to begin the data transfer to the external device. The SCSI controller interface logic continues to monitor the state of the transfer and communicate the state to microprocessor when needed, including interrupts issued by the SCSI controller 270 when data transfer is complete or if an error occurs during transfer. In the present embodiment, the SCSI controller interface logic 260 further identifies to the SCSI controller 270 the starting and ending addresses of the data located in the compressed data buffers 250 which are ready to be transferred to the external device 280 as the addresses of the buffer the data received from the device are to be written to. Thus, as the designated external device changes and the type of device changes, the SCSI interface logic 260 is updated accordingly with the device particular information. As will be subsequently explained, this external device specific information can be stored in the Flash memory 240, for nonvolatile and easy access during processing.

The flash memory 240 is coupled to command/data registers and application interface logic 215, microprocessor 230 and data compression coprocessor 220. The flash memory preferably stores the operating system, interface code as well as the various device drivers of external devices which may be coupled to the controller 20. The flash memory contributes to the independence of the controller 20 from the host system by eliminating the need to transfer such information from the host. For example, when a backup session commences, the bootstrap code causes the operating system, interface code utilized by interface logic and device-specific drivers to be uploaded from flash memory 240 to memory 225. To maximize the amount of information that can be stored in the flash memory, it is preferred that the information is stored in a compressed format. The compression and decompression operations can be performed by the data compression coprocessor located on the controller. For example, the boot strap code would cause the information to be read from flash memory (e.g. operating system and device drivers) to be processed through the data compression coprocessor prior to storage in memory 225.

It should be noted that there may be multiple external devices connected through SCSI bus 281 to data compression controller 20 and each device 280 may require a different device driver to be uploaded to memory 225. Therefore, to minimize processing overhead and memory usage, it is preferred that controller 20 is configured for the specific external device by microprocessor 230 uploading a specific driver program as it is needed. Furthermore, the controller operation can be updated by simply updating the flash memory. For example, to update or upgrade the operating system or device drivers, a program executed on the host could write to and update the flash memory and therefore the controller firmware. This provides added flexibility and versatility by allowing upgrades and programming changes to the controller to be easily implemented.

The microprocessor 230, preferably a processor such as an Intel 80186, manufactured by Intel Corporation, Santa Clara, Calif., is coupled to application interface logic 215, data compression coprocessor interface logic 216, memory 225, compressed data buffers 250, SCSI controller interface logic 260 and Flash memory 240. The microprocessor eliminates the need for the host system to monitor the state of the data through the controller and coordinate and direct the interface logic 215, 216 and 240. Thus, the role of the host system is reduced to transferring data to be compressed and initialization commands, such as commands indicating when to begin processing and identifying the type and specific external device the data is to be output. Depending upon the specific implementation, the host system may also communicate other commands to the microprocessor through application interface logic 215. By eliminating the host system involvement in the compression and data output process, the host system has the ability to execute other unrelated processes while the compression process is ongoing.

As noted above, microprocessor 230 communicates with host channel 200 through application interface logic 215, which communicates with host channel 200 through either interrupt or polling, as will be apparent to those skilled in the art. Polling may be used when available interrupts are unavailable. For example, the host system may poll for an acknowledgment that data have been written to the intended storage drive.

To further minimize the interaction of the host system during compression processing and input/output to the external device, on-board microprocessor 230 and memory 225 help implement the continuous data streaming capability without incurring excessive bus transactions between the host system and data compression controller 20 by the need for monitoring and coordinating the instruction of the components of the controller typically performed by the host system. The microprocessor operates in accordance with software provided to monitor and control the flow of data through and out of the controller into the application logic 216, the data compression coprocessor interface logic 216, and the SCSI controller interface logic 260.

It should be understood by those skilled in the art that although application interface logic 215, data compression coprocessor interface logic 216, and SCSI controller interface logic 260 are represented as distinct and separate functional blocks in FIG. 3, they may be implemented in software and, therefore, may in part be physically implemented in one contiguous block within memory 225 and executed by a dedicated or general purpose processor.

The microprocessor 230 allows the data to be compressed in data compression coprocessor 220 while concurrently sending out the compressed data from compressed data buffer 250 to external drive 280 through SCSI controller 270. Transferring the data through SCSI controller 270 will continue until an interrupt is received by microprocessor 230 from compression coprocessor 220, indicating that the compression process has been completed by compression coprocessor 220. Microprocessor 230 can then direct more uncompressed data, if available, to be transferred into data compression coprocessor 220 from buffers 210 and 211, while the compressed data are continuously transferred out through SCSI controller 270 from compressed data buffer 250. On the other hand, external device 280 can also generate an interrupt to microprocessor 230 through SCSI controller interface logic 260 to request more data from compressed data buffer 250, while the raw data are transferred into data buffers 210, 211, or while the raw data are compressed by data compression coprocessor 220. Memory 225 is also configurable to accommodate the faster processor speed as will be appreciated to those skilled in the art.

With reference made to FIG. 3, data transfers from host channel 200 to uncompressed data buffers 210, 211, are ping-ponged such that when one buffer is full, data from host channel 200 need not wait until the first buffer is empty before data can be loaded into the second buffer. Preferably, buffers 210, 211, are 32 Kbytes. It should be apparent to those skilled in the arts that the size of the buffers could be adjusted based on the system requirement. Data compression coprocessor interface logic 216 monitors the buffers 210, 211, and directs compression coprocessor 220 to begin compressing data from the filled buffer preferably by using a burst mode DMA transfer of data from one of the buffers 210, 211. Compression coprocessor 220 communicates with microprocessor 230 through compression coprocessor interface logic 216 by issuing an interrupt when compression is completed. While waiting for an interrupt from compression coprocessor 220, the microprocessor can direct application interface logic 215 to read additional data to be compressed from host channel 200. The microprocessor can also direct SCSI interface 260 to start sending data to device 280 when compressed data buffer 250 contains data to be output. Preferably the microprocessor directs SCSI interface 260 to begin sending data to external device 280 when the data buffer 250 is filled to a sufficient level for efficient data streaming to the output device. Currently, streaming can efficiently occur when compressed data buffer 250 is 70%-80% full. However, it should be apparent to those skilled in the art that this level can be readily adjusted based on through-put requirements and the speed of the external device 280.

As noted previously, after the data have been compressed by compression coprocessor 220, the data are stored in compressed data buffer 250. At this time, under the control of microprocessor 230, headers, error-correction code, and formatting requirements are added as dictated by the specific device driver program stored in memory 225. It should be noted that the specific device driver program was previously uploaded during system power-up to program memory 225 by flash memory 240.

When one buffer is filled to a predetermined capacity, compression coprocessor interface logic 216, which monitors the state of the buffers, returns the buffer status to microprocessor 230. Microprocessor 230 in turn communicates with compression coprocessor 220 with respect to which buffer to unload data for the compression operation. During compression by compression coprocessor 220, compression RAM 221 stores multiple compression and decompression histories as part of the compression processing accomplished within compression coprocessor 220. Once the data are compressed, the header information and ECC information are added onto data by microprocessor 230 in compressed data buffer 250. Microprocessor 230 also issues starting and ending addresses to SCSI interface logic 260 such that the data are transferred directly from compressed data buffers 250 to device 280.

The microprocessor 230 provides the added capability to compare the sizes of the compressed and uncompressed data. For example, as each buffer of data is compressed, the microprocessor 230 compares the size of the compressed and uncompressed data. If the data has been compressed prior to input to the compression coprocessor, the data output will be larger than the input as the data is not further compressible and since additional format and header information must be added in preparation for output to the external device. In this instance, the microprocessor will recognize the error and will instead, via bypass route 229, access the original data and output the original data to the external device 280. Although it is preferred that this test is performed on a block by block basis, other criteria for determining when to compare the size of compressed and uncompressed data may be utilized. Bypass route 229 can be implemented as a separate connection or by transferring the data through compression coprocessor 220 without performing a compression operation.

Figure 4:
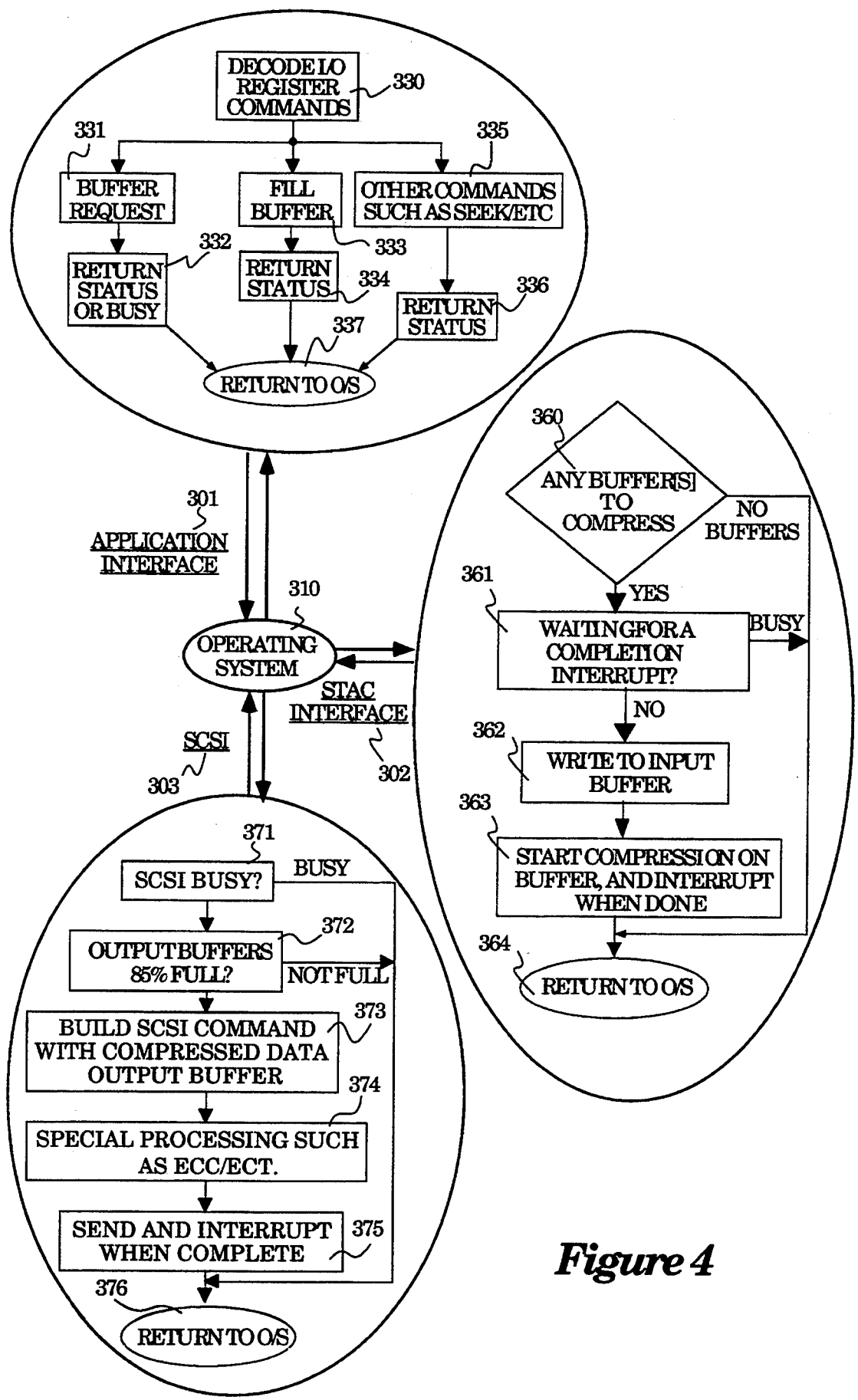
FIG. 4 illustrates a flow chart of the operation of the data compression controller.

The flow chart of FIG. 4 illustrates an exemplary process flow of the data compression controller 40. The flow chart represents any of the three concurrent modes, or tasks, which may be performed by the operating system of the controlling processor. As such, the processor can achieve multi-tasking by attending to one mode until receiving a completion interrupt from another mode. By activating various modes of operation concurrently, the data flow can be streamed between the host system and external devices to generate a greater through-put. In the first embodiment described, these functions are primarily coordinated by the host system through the application interface logic. The status and interrupts are provided as needed to the host system by the application interface logic such that the host system can issue commands to the controller. In the second embodiment described herein, these functions are performed by the microprocessor located on the controller.

When the data compression controller is initially powered up, commands issued through the host channel may be received through application interface mode 301. In the application interface mode 301, through the application interface logic, I/O registers are polled and commands decoded 330 to determine one of the following: 1) whether there is a buffer request from the host system to the data compression controller 331, 2) whether the host system is filling the data buffer with data 333, or 3) whether there are other I/O register commands such as SEEK command 335. If there is a buffer request, the status of the buffers, or a busy acknowledgment if the buffers are busy, is returned and application interface mode returns control to the operating system of the processor 337. For other I/O register commands, the status of the buffers is also returned and the control is transferred back to the operating system of the processor 337. With control returned, the operating system does not need to remain in a dormant mode and can thus attend to other modes until it is called by an interrupt.

When the operating system is in STAC interface mode 302, the operating system first determines whether there is any data in the buffers to compress 360 and if there is, the operating system determines whether it is awaiting a completion interrupt 361, since the data compression coprocessor may be busy and no further compression can be initiated. If data are not in the buffers, data are written into the internal buffers in the data compression coprocessor 362 to start compression on the data from the internal buffers 361. A completion interrupt is issued to the host system when compression is completed so that the operating system may regain control 364. Note that control is returned to the operating system 364 when there are no more data in the internal buffers to compress or when a completion interrupt is issued. Multitasking can thus be accomplished among the various tasks since after compression is initiated, the operating system is free to handle other tasks until a completion interrupt is received by the host system.

When the operating system is in SCSI Mode 303, the operating system first checks whether the SCSI controller is busy 371. If the SCSI controller is not busy, the operating system determines whether the internal output buffers are filled to a predetermined amount, currently set at 85%, to achieve streaming. If the SCSI controller is not busy and the buffers are 85% filled, a SCSI command with the output buffers is built 373 and special processing such as ECC, etc., is completed 374. Data are then transferred through the SCSI controller to the devices and a completion interrupt is issued to the host system 375. Afterwards, control of the system is again returned to the operating system on the host system 376.

Therefore, multi-tasking on the controller is provided to monitor and control the various states of the components on the controller to provide a constant flow of data through the controller. If the controller is implemented in accordance with the first embodiment, the operating system described herein is preferably implemented as an application program. In the second embodiment, the operating system of the microprocessor may be configured to operate as described or an application program may be designed to operate in conjunction with a general purpose operating system.

As will be understood, the data compression controller of the present invention also performs the process of restoring compressed data located on an external device to the host system. For example, in the present embodiment and with reference to FIG. 3, the data from the external device 280 are first read to compressed data buffer 250 through SCSI controller 270 under the direction of SCSI interface logic 260. As the data are stored in compressed data buffer 250, the microprocessor 230 is notified, by the SCSI interface logic 260, that the data is located in the buffer 250 and strips the header and format, as well as the ECC information. The compressed data from compressed data buffer 250 are decompressed by compression coprocessor 220 and the uncompressed data are then transferred to buffers 210, 211, for subsequent transfer to the host system 21 by writing to host channel 200. Preferably, the microprocessor will examine the data stored in buffer 250 to determine if the data are in an uncompressed form. If the data are already uncompressed, microprocessor 230 directs compression coprocessor 220 to transfer data from compressed data buffer 250 to buffers 210, 211, without decompression, for output to the host system 21.

The data compression controller of the present invention has the power and flexibility to perform a number of different tasks beyond compression, decompression and data I/O. For example, format conversions between SCSI-connected drives can also be achieved. By using microprocessor 230, the data can be reformatted from a first drive format into a second drive format while host channel 200 is performing other tasks. As will be appreciated by those skilled in the art, this situation occurs when multiple drives with different formats are connected to data compression controller 20 through SCSI controller 270. For example, microprocessor 230 can transfer the data from Drive A to compressed data buffers 250 through SCSI controller 270. The data can be passed through compression coprocessor 220 or reformatted as dictated by microprocessor 230 before the data are read back to Drive B also connected through SCSI controller 270. As is apparent to one skilled in the art, through modification of the software and firmware, the controller can perform many other tasks as a general purpose controller.

A high throughput data compression controller for processing and transferring data between a host system and external devices is disclosed. The data compression controller of the present invention allows data to be continuously streamed while freeing the host system's CPU for other tasks. In addition, the data controller of the present invention is software configurable such that its operation is independent of the connected devices. The data compression controller further supports all available DMA channels and interrupts on the host system.

What is claimed is:

1. A data compression controller for streaming data transfers between a host system and at least one device, said host system coupled to said controller through a host channel, said data compression controller comprising:

first buffer means for storing data of first format;

second buffer means for storing data of second format;

compression coprocessor coupled to said first buffer means and said second buffer means for converting data between said first format and second format at a determined compression ratio, said compression coprocessor maintaining a compression history corresponding to data of said first and second formats, said compression coprocessor generating a first completion interrupt upon completion;

input/output (I/O) means coupled to said second buffer means for transferring data of said second format between said device and said second buffer means, said I/O means generating a second interrupt upon completion;

compression coprocessor interface means coupled to said compression coprocessor for initiating transfer of one of said data of first and second formats into said compression coprocessor, said compression coprocessor interface means also causing the output of said compression coprocessor to be coupled to one of said second and first buffer means, respectively, said compression coprocessor interface means monitoring said compression coprocessor and transferring said first completion interrupt when said compression coprocessor is completed;

application interface means coupled to said host channel, said application interface means communicating with said host system for loading and unloading said first buffer means and second buffer means, said application interface means monitoring said first buffer means and issuing a third completion interrupt when said first buffer means is filled to a predetermined level, said application interface means also monitoring said second buffer means and issuing a fourth completion interrupt when said second buffer means is filled to a predetermined level;

I/O interface means for transferring said data of second format between said I/O means and said device, said I/O interface means coupling said I/O means to said device when said second buffer means is filled to said predetermined level, said I/O interface means monitoring said I/O means and transferring said second interrupt;

processor means for performing multitasking among said compression compressor, said first buffer means, said second buffer means, said host channel and said I/O means responsive to one of said first, second, third, and fourth completion interrupts received, said processor means performing formatting and error checking of data of said second format in said second buffer means; and program memory means coupled to said processor means and said compression compressor, said program memory storing a predetermined operating system for operating said processor means, said program memory means storing one of a plurality of predetermined device drivers unique to said device coupled to said host system for driving said device.

2. A data compression controller according to claim 1 further comprising:
flash memory coupled to said processor means for storing said predetermined operating system and said plurality of predetermined device drivers to uploading onto said program memory means.

3. A data compression controller according to claim 2, further comprising:
bootstrap loader means coupled to said flash memory for booting up said data controller by causing said flash memory to upload to said program memory means upon power up, said bootstrap loader means then disabling said flash memory and passing control to said application interface means for monitoring said host channel.

4. A data compression controller according to claim 2, wherein said I/O means is a SCSI device for transferring data between said data compression controller and said device.

5. A data compression controller according to claim 4, further comprising bypass means coupled to said processor means, said first buffer means, and said second buffer means for transferring data of said first format directly to said second buffer means when data of said first format is already in a compressed format.

6. A data compression controller according to claim 5, wherein said compression coprocessor comprises a compression history memory for storing a plurality of compression and de-compression histories corresponding to data of said first format and its corresponding data of second format.

7. A data compression controller according to claim 6, wherein said first buffer means comprises a double buffer memory for concurrently loading a first buffer while unloading a second buffer.

8. A data compression controller according to claim 4, wherein said flash memory stores said predetermined operating system and said plurality of predetermined device drivers in compressed format.

9. A data compression controller according to claim 8, wherein said bootstrap loader means uploads said predetermined operating system and said plurality of predetermined device drivers onto said program memory means.

10. In a computer system, a method for performing a data compression and transferring data between a host system and at least one external device through a data compression controller, said method comprising the steps of:
transferring data from the host memory to an input buffer of a compression controller comprising a compression compressor until the transfer is complete or the input buffer is full;
issuing a compression coprocessor interrupt to the microprocessor of the compression controller when the transfer is complete or the input buffer is approximately full;
upon receipt of the compression coprocessor interrupt, the microprocessor controlling compression coprocessor of the compression controller to read the data from the input buffer, compress the data and store the compressed data in an output buffer;
transferring header information into the output buffer such that header information is associated with each block of data stored in an output buffer;
issuing a completion interrupt to the microprocessor when the compression is complete or the output buffer is approximately full;
upon receipt of the completion interrupt, said microprocessor,
controlling an I/O controller to transferring data from the output buffer of the compression controller to the external device until the transfer is complete or the output buffer is empty, and
issuing an interrupt to the host to transfer additional data to the input buffer;
said microprocessor comparing a predetermined quantity of input data to the corresponding quantity of output data;
if the output data is greater than the input data, controlling the I/O controller to transfer the data of the input buffer to the external device;
wherein data is continuously loaded from the host system, compressed and stored in the external device.

11. The method according to claim 10 further comprising the step of:
said microprocessor monitoring the input buffer and issuing an interrupt to the host to transfer data to the input buffer when the input buffer is approximately empty and issuing an interrupt to the host to cease in the transfer of data to the input buffer when the input buffer is full.

12. The method according to claim 10 further comprising the step of:
said microprocessor monitoring the output buffer and issuing an command to the I/O to transfer data from the output to the external device when the output buffer contains a predetermined amount of data.

13. The method as set forth in claim 12, wherein the predetermined amount comprises an amount that is sufficient for efficient data streaming to the external device.

* * * * *

UNITED STATES PATENT AND TRADEMARK OFFICE
CERTIFICATE OF CORRECTION

PATENT NO. : 5,357,614
DATED : October 18, 1994
INVENTOR(S) : Ravi Pattisam, et. al.

It is certified that error appears in the above-indentified patent and that said Letters Patent is hereby corrected as shown below:

Title page, item
[57] Abstract

| | | |
|---|---|---|
| Line 14 | Delete "for example, if the" | |
| Line 24 | Delete "Therefore a" | |
| Line 25 | Delete "single" | |

Col. 7, Line 28    Delete "NFFU"    Insert --MPU--

Signed and Sealed this

Third Day of January, 1995

Attest:

BRUCE LEHMAN

Attesting Officer         Commissioner of Patents and Trademarks

UNITED STATES PATENT AND TRADEMARK OFFICE
CERTIFICATE OF CORRECTION

PATENT NO. : 5,357,614
DATED : October 18, 1994
INVENTOR(S) : Ravi Pattisam, et al It is certified that error appears in the above-indentified patent and that said Letters Patent is hereby corrected as shown below:

Col. 11, Line 15    After the word "sent"    Insert --to--

Col. 11, Line 15    Delete --SCSIdevice--    Insert --SCSI device--

Signed and Sealed this

Fourth Day of April, 1995

Attest:

BRUCE LEHMAN

Attesting Officer    Commissioner of Patents and Trademarks